US008968986B2

(12) United States Patent
Conner et al.

(10) Patent No.: US 8,968,986 B2
(45) Date of Patent: Mar. 3, 2015

(54) ELECTROCHEMICAL CELL

(75) Inventors: Jacob Conner, Springfield, MO (US); Saibal Mitra, Springfield, MO (US)

(73) Assignee: U.S. Photonics, Inc., Springfield, MO (US)

( * ) Notice: Subject to any disclaimer, the term of this patent is extended or adjusted under 35 U.S.C. 154(b) by 955 days.

(21) Appl. No.: 12/962,353

(22) Filed: Dec. 7, 2010

(65) Prior Publication Data

US 2011/0159373 A1 Jun. 30, 2011

Related U.S. Application Data

(60) Provisional application No. 61/291,259, filed on Dec. 30, 2009.

(51) Int. Cl.
| | | |
|---|---|---|
| H01M 2/18 | (2006.01) | |
| G03F 7/20 | (2006.01) | |
| H01M 2/14 | (2006.01) | |
| G03F 7/30 | (2006.01) | |
| H01M 2/16 | (2006.01) | |
| H01M 10/04 | (2006.01) | |

(52) U.S. Cl.
CPC .............. *H01M 2/14* (2013.01); *G03F 7/2002* (2013.01); *G03F 7/30* (2013.01); *G03F 7/2051* (2013.01); *H01M 2/164* (2013.01); *H01M 2/1653* (2013.01); *H01M 10/0472* (2013.01)
USPC ......................................................... 430/319

(58) Field of Classification Search
CPC . H01M 2/14; H01M 2/1653; H01M 10/0472; G03F 7/2002; G03F 7/2051; G03F 7/30
USPC .................... 429/400; 430/322, 325, 326
See application file for complete search history.

(56) References Cited

U.S. PATENT DOCUMENTS

| | | |
|---|---|---|
| 6,423,444 B1 | 7/2002 | Ying |
| 6,811,903 B2 | 11/2004 | Vartak |
| 7,060,390 B2 | 6/2006 | Chen |
| 7,170,739 B1 | 1/2007 | Arora |
| 2004/0110092 A1* | 6/2004 | Lin ............................. 430/311 |
| 2005/0037920 A1* | 2/2005 | Devenney et al. ............ 502/313 |
| 2005/0106493 A1* | 5/2005 | Ho et al. .................... 430/270.1 |
| 2005/0275814 A1* | 12/2005 | Eib et al. ...................... 355/18 |
| 2008/0145750 A1 | 6/2008 | Yang |

* cited by examiner

*Primary Examiner* — Brittany Raymond
(74) *Attorney, Agent, or Firm* — Da Vinci's Notebook, LLC

(57) ABSTRACT

An electrochemical cell, membrane, and method for making the membrane and electrochemical cell are disclosed in which ion passage channels of the membrane have advantageous characteristics relating to dimensions, positioning, and patterning. The ion passage channels are formed by selected means of radiation, many of which require post-radiation manipulation.

12 Claims, 13 Drawing Sheets

100   102

100

100

100

FIG. 18
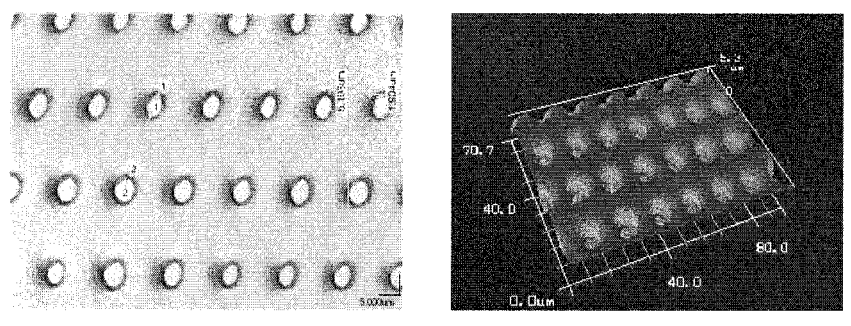
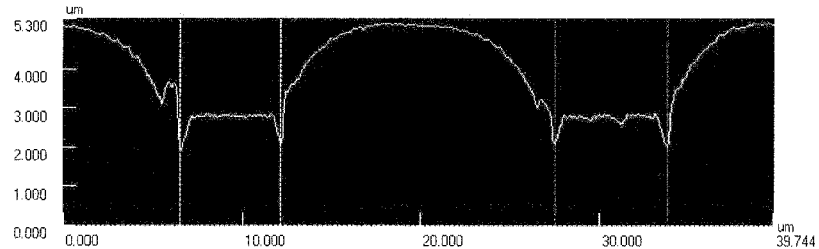
| Profile1 | Horz. dist. |
|---|---|
| Seg.1 | 5.590um |
| Seg.2 | 6.261um |
| | |
| Total | 11.851um |
| Max. | 6.261um |
| Min. | 5.590um |
| Ave. | 5.925um |
| Std. DV | 0.335um |
| 3sigma | 1.006um |

ELECTROCHEMICAL CELL

CROSS-REFERENCE TO RELATED APPLICATIONS

This application claims priority from U.S. Provisional Patent Application Ser. No. 61/291,259, filed Dec. 30, 2009, entitled Electrochemical Cell, the entire disclosure of which is hereby incorporated by reference.

FIELD OF THE INVENTION

The present invention relates to the field of energy storage and creation and more specifically to the field of batteries composed of nanoscale components.

BACKGROUND

The invention of the laser was one of the most important scientific and technological developments in the past century. No material is immune to damage from high energy, focused laser beam where the induced electric field is high enough to produce non-linear optical breakdown. Material modification using laser has been possible since the electric fields produced by the laser beam are comparable to the Coulomb field an electron sees in the proximity of the atomic nucleus leading to avalanche ionization. In this process, free electrons in the target material accelerate due to the high electric fields produced by the laser and create an avalanche of free electrons through collisions with other atoms. This process also occurs in transparent materials which become opaque when the free electron density approaches the critical density for that particular light. It is important to note that this optical breakdown has a non-linear dependence on intensity and this allows for the damage to be restricted to the subdiffraction limit by "thresholding" allowing the fabrication of nanoscale features.

Lasers are commonly used for micro-component fabrication. However, use of lasers to form microstructures commonly results in material fractures beyond the zone of ablation, unsuitably regulated ablation positioning, varied aperture and structure dimensions, and use of materials indifferent to the characteristics of photon radiation. Therefore, there is a need for ion passage membranes with channels having substantially uniform and reproducible spacing, dimensions, and arrangement; capable of effective mass production; and extreme nanoscale characteristics.

SUMMARY

The present invention is directed to an electrochemical cell and an ion passage membrane for an electrochemical cell. The ion-passage membrane includes a dielectric substrate with at least one highly-ordered row of ion passage channels. The ion passage channels preferably include a diameter of less than 600 nm and may include diameters of less than 20 nm. The channels may include diameters that are tailored to be substantially uniform with their neighbors or all channels of the membrane. The membrane may include both rows and columns of ion passage channels.

The ion-exchange battery includes the membrane of the present invention with an anode assembly and a cathode assembly. Within the ion passage channels is a suitable electrolyte.

The present invention further includes methods for fabricating the membrane of the present invention. A method for fabricating the membrane of the present invention includes fixing the pulse energy of a laser. An ablation value defined by a ratio of laser fluence to the threshold fluence value of a dielectric substrate is determined. The substrate is ablated with an ablation value less than 4, and preferably approaching 1, to form an ion passage channel.

A method for fabricated the membrane of the present invention includes fixing the pulse energy of a laser. An ablation value defined by a ration of laser fluence to the threshold fluence value of a dielectric substrate is determined. A uniform passage diameter of an ion passage is determined. The substrate undergoes pulse ablation to form the ion passage with the uniform ion passage diameter at a pulse duration timed to permit the ion passage diameter to be reproduced within less than 10% at a substantially constant ablation value. A method for fabricating the membrane of the present invention includes providing a dielectric substrate with a substantially planar substrate surface. The substantially planar surface is mapped into a coordinate grid. A user predefines a uniform passage diameter of the ion passage. The substrate undergoes pulse ablating to form the ion passage with the uniform ion passage diameter at a pulse duration timed to permit the uniform ion passage diameter to be reproduced within 10% at a constant ablation value. The coordinates of the ion passage are stored for later retrieval.

These aspects of the invention are not meant to be exclusive. Furthermore, some features may apply to certain versions of the invention, but not others. Other features, aspects, and advantages of the present invention will be readily apparent to those of ordinary skill in the art when read in conjunction with the following description, and accompanying drawings.

BRIEF DESCRIPTION OF THE DRAWINGS

FIG. 18 is a view of ion passage channel characteristics.

DETAILED DESCRIPTION

Figure 1:
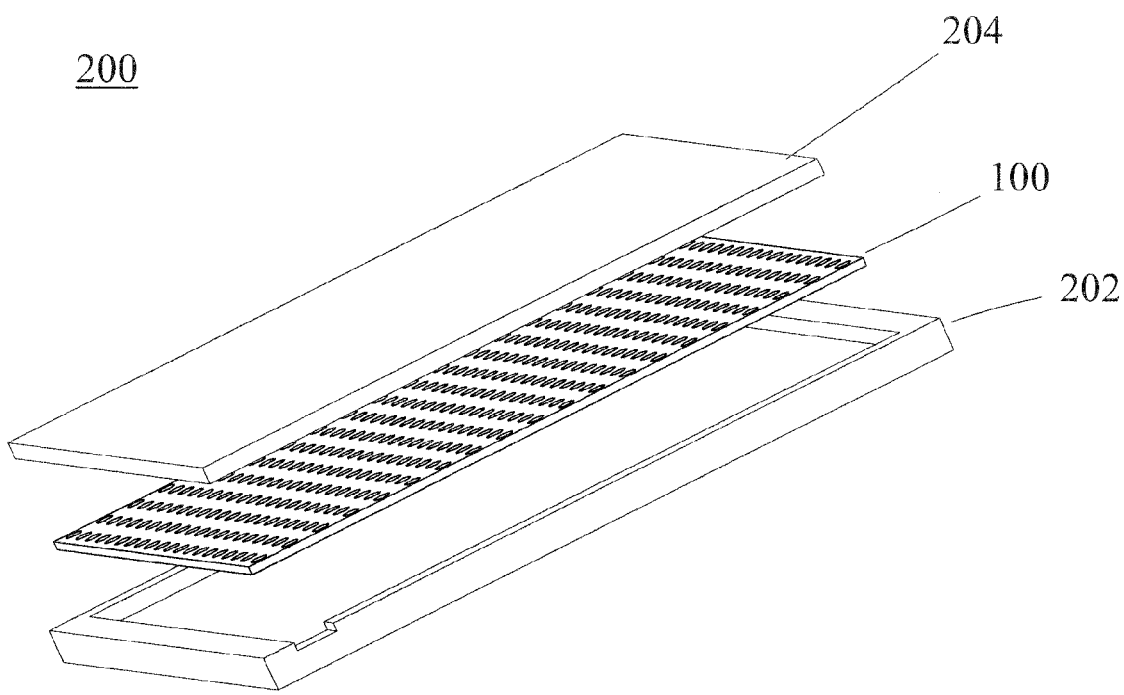
FIG. 1 is a perspective view of the ion exchange battery of the present invention.

Referring first to FIG. 1, a basic embodiment of an electrochemical cell, as an ion exchange battery 200, is shown. The ion exchange battery 200 may be utilized in connection with any ion-exchange system, but is preferably used in conjunction with a Lithium ion exchange system. The Li ion is the current preferred choice for rechargeable batteries. Li may be used with a large class of solid and liquid electrolytes as well as a large class of cathode materials, primarily metal oxides with three-dimensional networks of intercalation sites in which the Li ion resides in the discharged state. The present invention is not restricted to this particular ion system, or batteries, but will primarily be discussed in reference to a Li ion battery system as it is contemporaneously emerging as the predominant high-density energy storage system contemporaneous to the drafting of this document. The present invention may be used with any ion system, e.g. Nickel Cadmium, or other means of energy transfer potentially improved by the characteristics of the present invention. The battery 200 includes an anode assembly 202, a membrane 100, electrolyte (not shown), and a cathode assembly 204.

The anode assembly 202 may include any anode, such as a single-piece anode, or combination of anodes currently utilized in the Li-ion battery arts. The preferred anode assembly 202 includes an anode sheet with nanoparticles of molybdenum oxide ($MoO_x$). Nano particles of transition metal oxides (like $MoO_x$, $WO_N$, and the like) can be easily grown by hotwire chemical vapor deposition by resistively heating a molybdenum or tungsten wire in an atmosphere of oxygen. The particle shape and size can be adjusted by controlling growth parameters like the reactor pressure, oxygen partial pressure, filament temperature, etc. It is preferred that any nanomaterial used should provide for substantial intercalation of Li ions.

The cathode assembly 204 may include any cathode or combination of cathodes currently utilized in the Li-ion battery arts. The preferred cathode assembly 204 includes $V_2O_5$ sol-gel. The preferred cathode is manufactured by coating a 10-50 nm graphite layer on thin aluminum foil by pulsed laser deposition and/or rf sputtering; annealing the graphite electrode at appropriate temperatures and times; and coating the graphite layer with a composite material composed of carbon nanotubes and $V_2O_5$.

Figure 2:
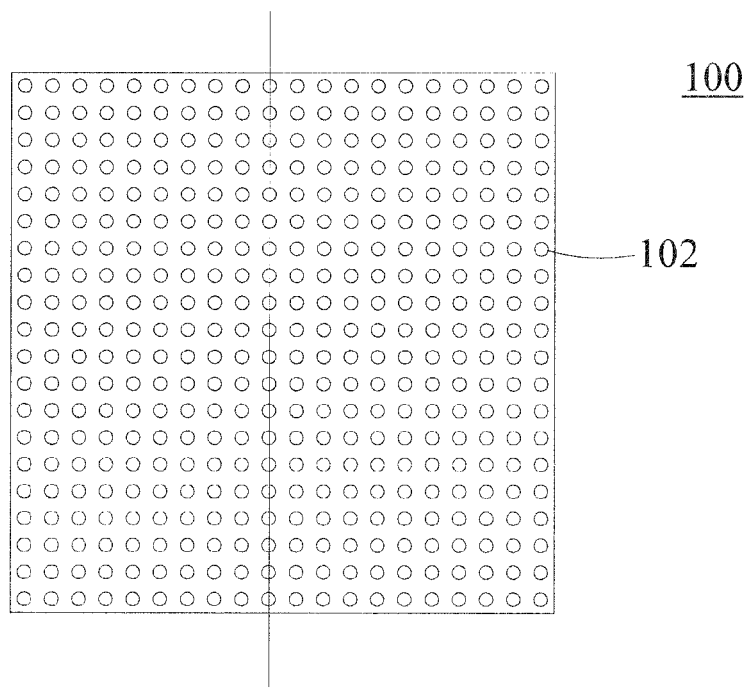
FIG. 2 is a top, plan view of the membrane of the present invention.

FIG. 2 depicts the membrane 100 of the present invention. As the membrane 100 is formed of a substrate material, which may be any dielectric material; it is understood that in many respects the term substrate and membrane are generally interchangeable when used in reference to actions performed on the substrate/membrane. Preferred substrate materials differ with the construction process and intended uses of the membrane. The membrane may be constructed through multiple processes, including pulsed avalanche ablatation, negative-tone multiphoton polymerization, positive-tone multiphoton polymerization, and other acceptable means. The present invention will be discussed with reference to pulsed avalanche ablatation, negative-tone multiphoton polymerization, positive-tone multiphoton polymerization notwithstanding the suitability of other available methods of membrane construction.

Figure 3:
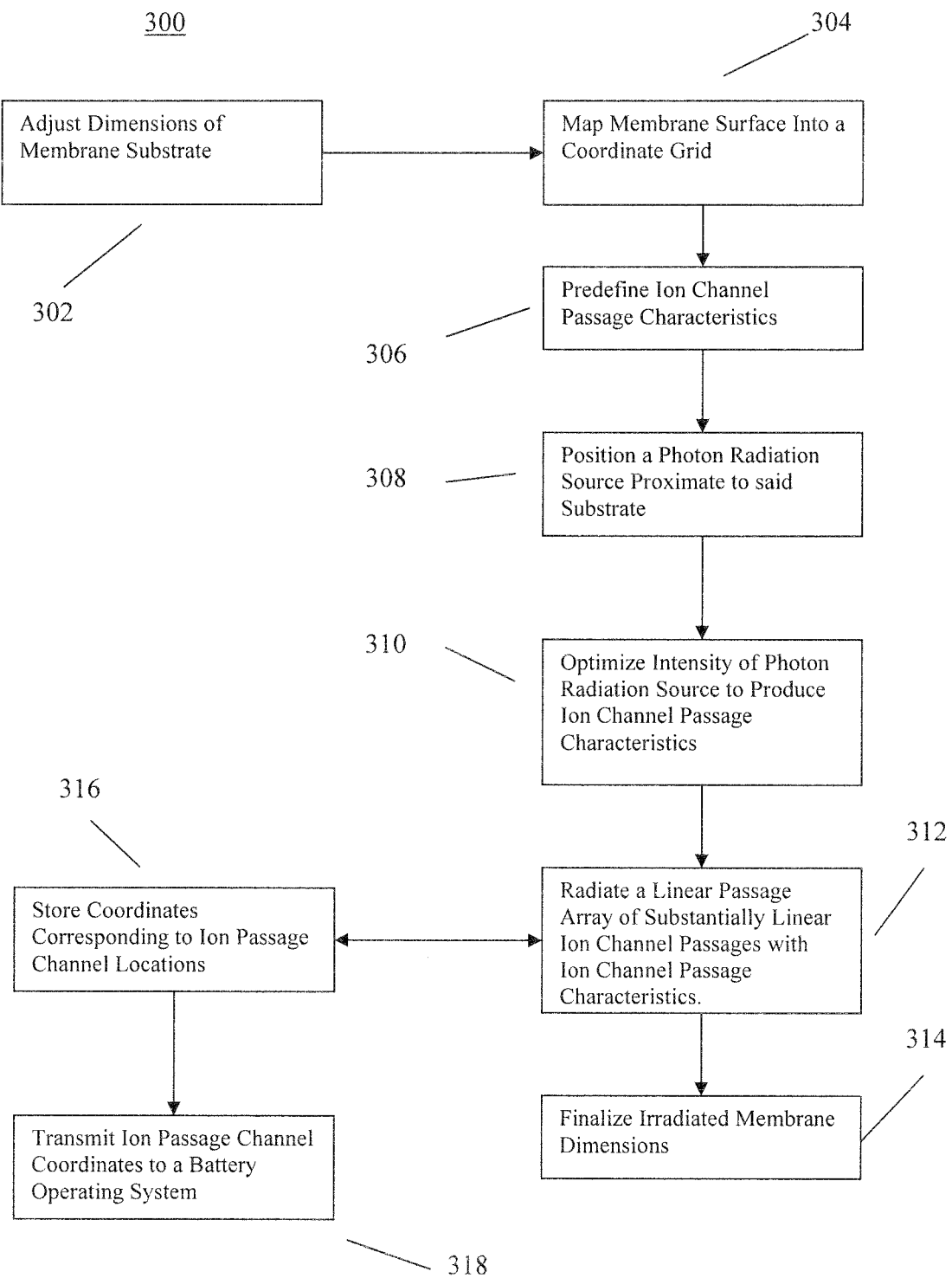
FIG. 3 is a view of the process of the present invention.

With reference to FIG. 3, a preferred method 300 of constructing an ion passage membrane is shown. For pulsed avalanche laser ablation, the preferred material includes polyimide, particularly KAPTON, available from E. I. du Pont de Nemours and Company. KAPTON results from a polycondensation reaction between pyromelletic dianhydride and 4,4' diaminodiphenyl ether. Prior radiating, the polyimide substrate ideal for processing should have a girth between 5 nm and 150 um and a preferred girth between 2 and 5 um. The girth is a significant restraint on many embodiments of the present invention, as pulsed avalanche radiation processes upon non-photosensitive substrates display a markedly negative characteristic: the single pulse threshold is subject to incubation effects, i.e. thresholds decrease with the number of pulses shot in a particular aperture. Thus, it is preferred that the girth of the substrate be constructed to permit cylindrical, rather than conical, apertures to be ablated in the substrate. However, the present invention may utilize any substantially cylindrical apertures, from cylindrical to frustoconical, which are variably cylindrical. The polyimide substrate should be provided with the preferred girth, which may include adjustment 302 to reach the preferred girth.

Figure 4:
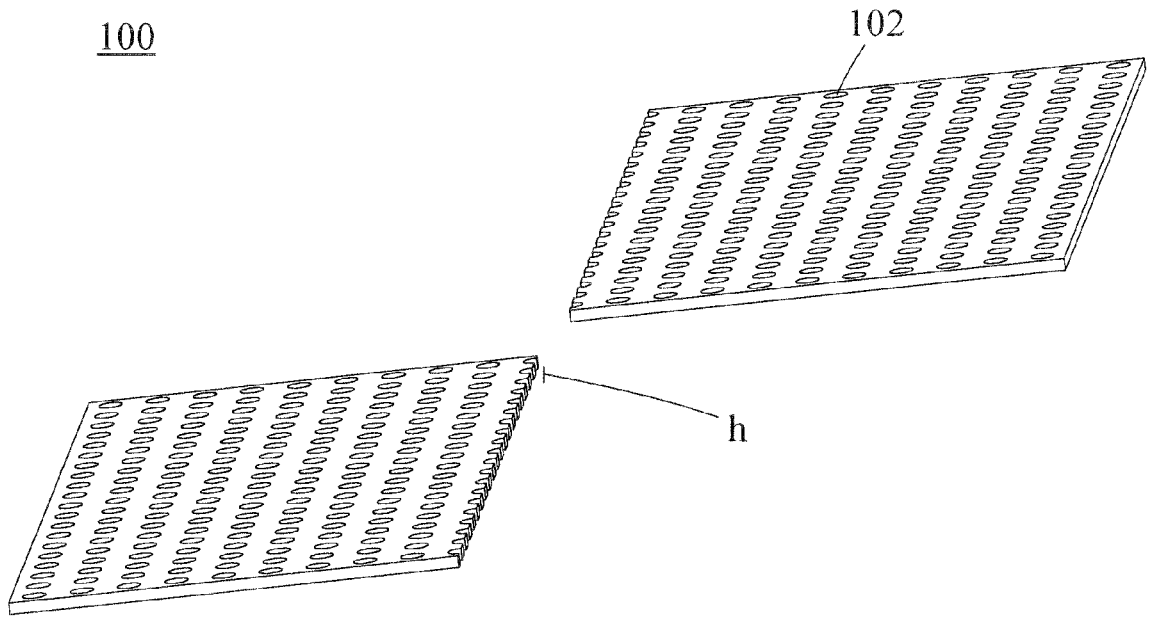
FIG. 4 is a perspective view of the membrane of the present invention.
Figure 5:
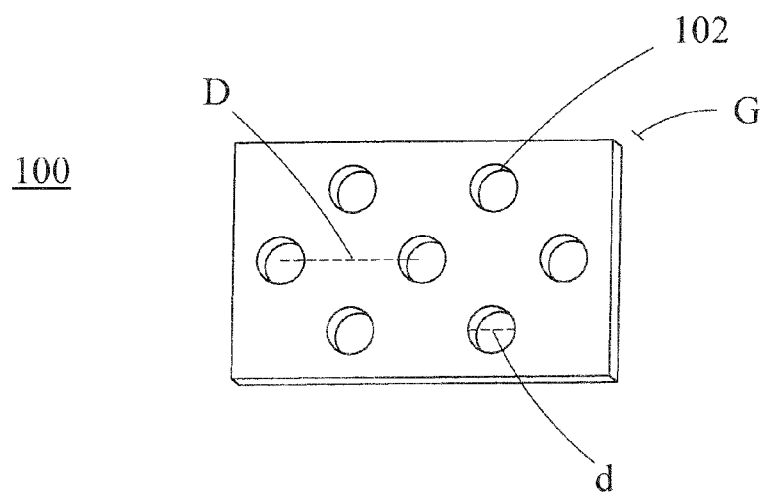
FIG. 5 is a perspective view of the membrane of the present invention.

Nanoscale battery membranes include multiple ion passage channels that permit the passage of ions between the electrodes. The properly controlled use of appropriate photon radiation source equipment permits accurate directed positioning of ion passage channels with predefined characteristics within an appropriate substrate material. Ion passage channel characteristics are then predefined 306 in relation to the substrate material. Contrasted with the use of chemical ion passage channel creation means, proper use of a radiation source permits ion passage channels to possess characteristics predefined by a user. The characteristics may include any of the ion passage channel characteristics discussed within this disclosure, including channel dimensions, channel spacing, channel shapes, and the like. Predefining means that one or more channels include characteristics divined by a user prior to radiation. As FIG. 4 and FIG. 5 show, the two primary ion passage channel 102 characteristics are depth h, diameter d, and distance D. As the nature of the membrane 100 is to permit passage of ions between electrodes, the membrane girth G should be equal to the passage depth h, which will have a direct impact upon the chosen passage diameter d.

Figure 6:
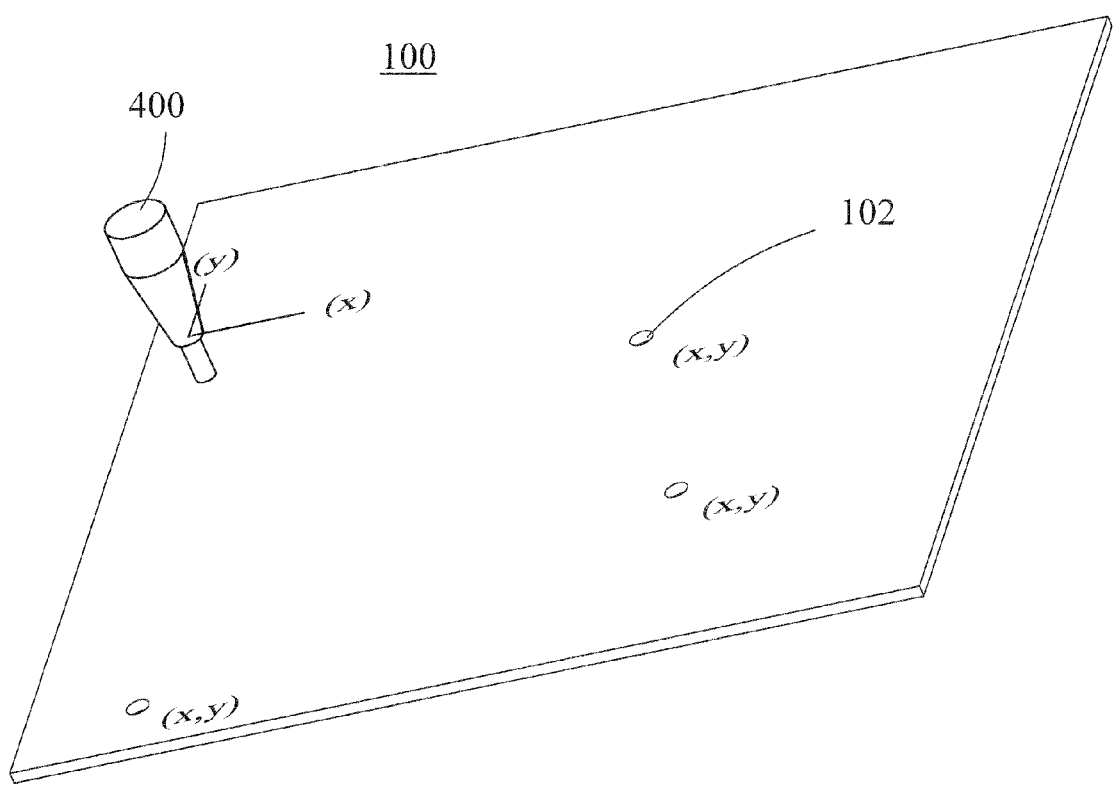
FIG. 6 is a perspective view of the membrane of the present invention during the process of the present invention.

With reference to both FIG. 3 and FIG. 6, the photon radiation source 400 is positioned 308 proximate to the membrane 100. Prior to any ablation, the membrane 100 may be characterized, for example by scanning electron microscope, to determine the dimensions of the membrane 100. The membrane 100 may then be mapped 304 by its dimensions to determine potential positions for ion passage channels on the membrane 100. The mapping 304 may be as basic as retaining by electronic storage medium approximate outer dimensions of the membrane; or be as complex as predetermining, or at least utilizing an arithmetic logic unit to predict, the approximate locations by (x,y) coordinate all ion passage channel locations of a membrane. Preferred mapping 304 includes conceptually subdividing the substrate material surface into a coordinate plane. The coordinate plane may then be used later for describing the positions for ion passage channels planned and existing. Furthermore, the dimensions of the membrane 100 may be altered to further suit predefined membrane dimensions.

The radiation source 400 coordinates are preferably tracked and positioned above predetermined membrane locations with reference to the stored membrane dimensions. For membranes of lesser dimensions, lesser complexity, or for applications that do not necessitate channel 102 positiontracking, the radiation source 400 coordinates need only be confined in operation to correspond to the positions above the membrane. In certain applications, e.g. nanocell batteries comprising between one and one-hundred ion passage channels, manual positioning of the radiation source may be appropriate. The preferred radiation source is CLARK MXR 2161 chirped pulse amplifier producing 120 femtosecond pulses between 1 kHz and 7 kHz and up to 2.5 watts average power with a maximum pulse energy of 0.8 mJ output. A preferred pulse range includes 100 to 150 femtosecond pulses; however, some materials may favorably accept up to 1 picosecond pulses. The energy is passed through a half wave plate and thin film polarizer plate for power control. The half wave plate is adjusted for 35 mW. Although it is preferred to use 35 mW at a 3 kHz repetition rate at 120 femtosecond duration; the power range may span from 25 mW to 50 mW. With a higher NA lens there will be a sharper focus and high Wattage per square centimeter. The power is proportional to the two photon cross section and thus controls the affected spotsize in conjunction with the objective lens. The laser energy is then focused into a Mitutoyo M Plan Apochromatic NIR HR objective lens 50× magnification 0.65 NA infinity corrected focal length of 200 and the working distance is approximately 1 cm.

The intensity of the radiation source is optimized 310 to produce the ion passage channel characteristics as predefined. The preferred ion passage channels, in existing preferred membrane substrate dimensions and consistency, vary in size from 200 nm to 5 um. For a 15 mm diameter, 0.50 Numerical Aperture, NIR aspheric lens with the characteristics of Table 1, the radiation source can routinely create mass reproducible ion passage channels with a diameter of 4 um at 775 nm wavelength at preferred membrane girths. Use of apochromatic lens provides a similar result at preferred membrane girths. Use of 387.5 nm wavelength light with a tighter depth of focus permits mass reproducible ion passage channels of 2 um diameter, and further down to between 20 nm and 40 nm diameter ion passage channels at preferred membrane girths.

TABLE 1

Example Lens Characteristics
Aspheric Lens 15 mm Dia. 0.50 Numerical Aperture, NIR Coated

| Dia (mm) | E.F.L. (mm) | F/# | B.F.L. (mm) | Radius (mm) | C.T. (mm) | Coating |
|---|---|---|---|---|---|---|
| 15.00 | 15.00 | 1.00 | 11.54 | 8.84 | 5.50 | NIR |

The adjustment 310 of beam intensity may correspond the substrate characteristics and the girth of the membrane. An operator may focus the beam's light on the smallest spot that the radiation source is capable of making, which is typically equal to the wavelength of light used to make the spot. Use of an ultrafast laser pulse can create features with sizes substantially less than that of the central wavelength of the laser pulse itself. First, a user need focus the ultrafast laser on a spot with a profile with a peak intensity in the center of the beam and smoothly decreases radially outward from the center (a "Gaussian" spot). By adjusting the intensity of the laser spot on the surface of the material so that just the peak of the beam is above threshold, then a user will remove material only in that very limited area. With the appropriate modification equipment, the aforementioned area can be approximately one-tenth the size of the spot itself.

Thus may the present invention create and utilize membranes having ion passage channels having the advantageous characteristics of the present invention in sizes equivalent to those of conventionally produced membranes, and from 100 um down to approximately 20 nm and less. Although membranes fabricated by pulsed avalanche ablation do not require substantial post construction processing, membranes fabricated utilizing utilized multiphoton polymerization do require substantial post construction processing.

The method 300 of the present invention may further utilize substrates adapted to laser characteristics, i.e. photosensitive materials ("photoresists"). When positive photoresists are used, multi-photon exposure results in chain scission into shorter units that can be dissolved and "washed out" during development. Any positive photoresist fulfilling the aspects of the present invention may be employed. A preferred photoresist includes HD8820, available from HD Microsystems. Commercial varieties of HD8820 are capable of supplying substrate girths of 5-7 um, which are generally too thick for preferred purposes of the present invention. A thinning material ("thinner") is used to adjust 302 the dimensions of substrate to girths of approximately 200 nm. Spinning the HD8820 with appropriate thinners, e.g. gamma buterolactone or n-methyl pyrrolidone (approximately 5% by weight), produces a substrate capable of the aforementioned preferred girth. The solution of thinner and HD8820 is added in an inert glovebox, stirred for 30 minutes, and covered with parafilm. The solution is then filtered using a WHATTMAN anodisk 200 nm pore syringe filter and transferred to an opaque container. All of the aforementioned interactions with the thinner and HD8820 occur under cleanroom conditions with cleanroom safelighting.

The thinned HD8820 is dispensed on an autodispense spin coater. 1-2 mL is spun in two stages: a first stage at 500 rpm, at 500 rpm/s, for 5 seconds; and a second stage at 3500 rpm, at 500 rpm/s, for 30 seconds. A further interaction of the thinned HD8820 with n-methyl pyrrolidone may optionally be used for automatic edge bead removal. The substance is then spin dried for 15 seconds. After the spin coating completes, the substrate is quickly removed from the spin coater and placed on a hot plate for a period of time suitable to drive off solvents and create a stable film of uniform thickness, e.g. 123 degrees Celsius for 180 seconds for an initial 1-2 mL thinned HD8820 substrate. As the substrate bakes, there is an additional reduction in substrate thickness. The substrate is then stored for up to 24 hours in a light tight container.

Figure 7:
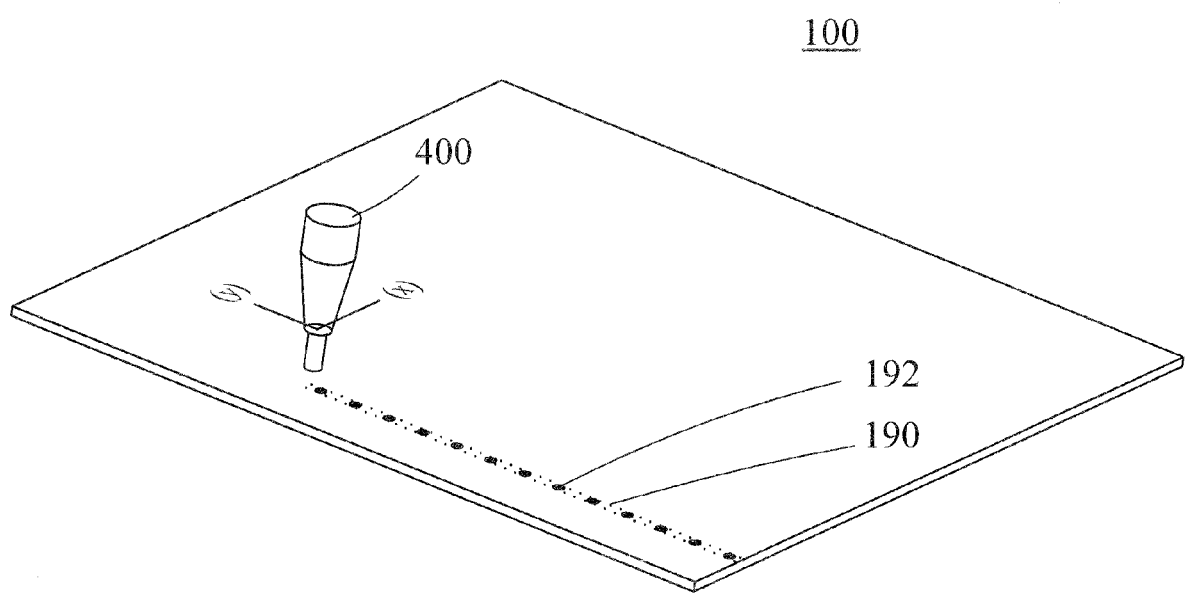
FIG. 7 is a perspective view of the membrane of the present invention during the process of the present invention.

Turning to FIG. 7 with continued reference to FIG. 3, the photon radiation source 400 is positioned 308 proximate to the membrane 100. The preferred radiation source is a CLARK MXR 2161 chirped pulse amplifier producing 120 femtosecond pulses between 1 kHz and 7 kHz and up to 2.5 watts average power with a maximum pulse energy of 0.8 mJ output. The pulse duration may vary as previously discussed. The energy is passed through a half wave plate and thin film polarizer plate for power control. The half wave plate is adjusted for 35 mW. The power is proportional to the two photon cross section and thus controls the affected spotsize in conjunction with the objective lens. The laser energy is then focused into a Mitutoyo M Plan Apochromatic NIR HR objective lens 50× magnification 0.65 NA infinity corrected focal length of 200 and the working distance is approximately 1 cm. The intensity of the radiation source is optimized 310 to produce the ion passage channel characteristics as predefined. It is preferred that the spot size of the 775 nm wavelength produces a two micron width. At an appropriate starting the point, the activated radiation source is actuated 312 in one-dimension across the surface of the membrane. The preferred activation power is between 280-500 mJ/cm$^2$. It is preferred to use a scanning speed of 1000 mm/min to produce discrete single shot pulses in a line 190 separated by a distance D of 16.66 um. The pulses will contact the membrane 100 in a position 192 that corresponds to the location of the yet-to-be-developed ion passage channels. Similarly, the beam dimensions, as related to the beam intensity, will correspond to the dimensions of the ion passage channel.

Figure 8:
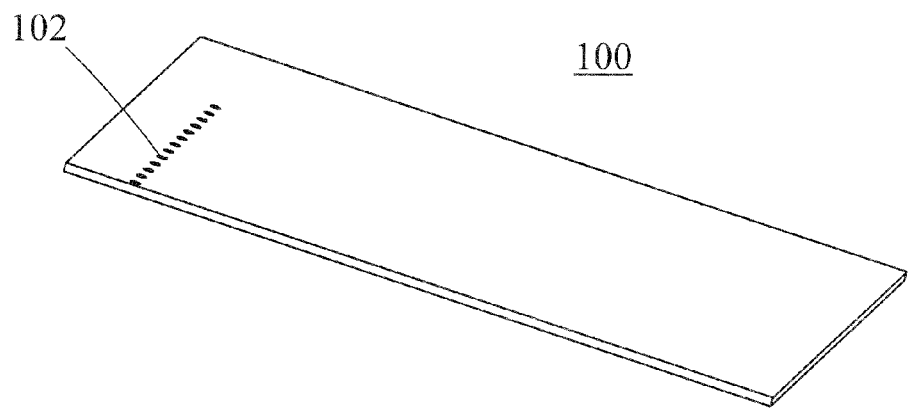
FIG. 8 is a perspective view of the membrane of the present invention during the process of the present invention.

Developing 314 the negative photoresist membrane includes treatment with 0.26 N Tetramethylammonium hydroxide in deionized water for 86 seconds using a puddle method and rocking agitation. The membrane is then rinsed in flowing deionized water for 10 seconds. Deionized water is preferred for high quality films. For a 0.21 N Tetramethylammonium hydroxide developer, longer development times are needed. As FIG. 8 shows, portions of the membrane activated and developed will dissolve to form the ion passage channels 102. Curing 314 the developed membrane includes heating the membrane from room temperature to 200° C. at 4° C./min and holding at 200° C. for 30 minutes. The membrane is then heated to 350° C. at 2.5° C./min and held at 350° C. for 60 minutes. The membrane is then gradually cooled to room temperature. The HD8820 may be cooled with an adhesion promoter to maintain the integrity of the film dimensions.

The method 300 of the present invention may further utilize negative photoresists wherein multi-photon exposure results in cross-linking of exposed polymer chains so the unexposed resist can be "washed out." Any negative photoresist fulfilling the aspects of the present invention may be employed. A preferred negative photoresist includes HD4410, available from HD Microsystems. Commercial varieties of HD4410 come capable of supplying substrate girths of 5-7 um, which are generally too thick for preferred purposes of the present invention. A thinner is used to adjust 302 the dimensions of substrate to girths of approximately 200 nm. Spinning the HD4410 with appropriate thinners, e.g. gamma buterolacetone or n-methyl pyrrolidone (approximately 5% by weight), produces a substrate capable of the aforementioned preferred girth. The solution of thinner and HD4410 is added in an inert glovebox, stirred for 30 minutes, and covered with parafilm. The solution is then filtered using a WHATTMAN anodisk 200 nm pore syringe filter and transferred to an opaque container. All of the aforementioned interactions with the thinner and HD4410 occur under cleanroom conditions with cleanroom safelighting.

The thinned HD4410 is dispensed on an autodispense spin coater. 1-2 mL is spun in two stages: a first stage at 500 rpm, at 500 rpm/s, for 5 seconds; and a second stage at 3500 rpm, at 500 rpm/s, for 30 seconds. A further interaction of the thinned HD4410 with n-methyl pyrrolidone may optionally be used for automatic edge bead removal. After the spin coating completes, the substrate is quickly removed from the spin coater and placed on a hot plate for a period of time suitable to drive off solvents and create a stable film of uniform thickness, e.g. 123° C. for 180 seconds for an initial 1-2 mL thinned HD4410 substrate. As the substrate bakes, there is an additional reduction in substrate thickness. The substrate is then stored for up to 24 hours in a light tight container.

Figure 9:
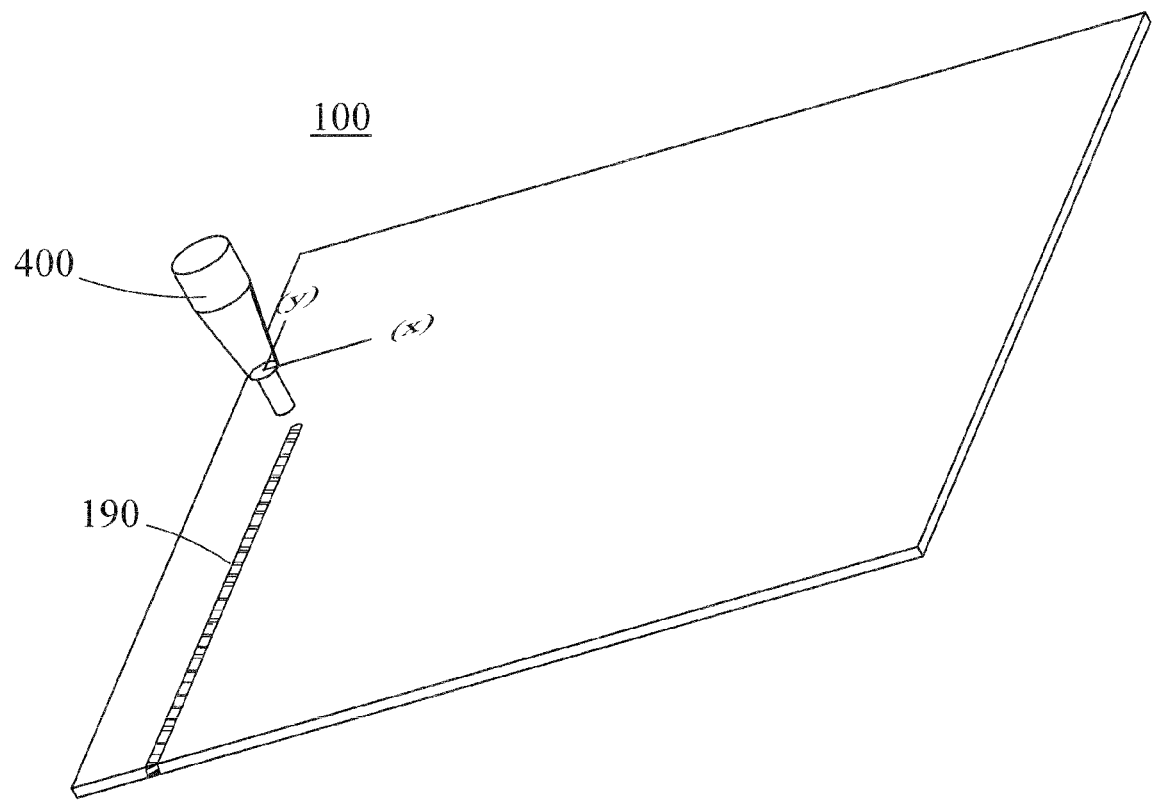
FIG. 9 is a perspective view of the membrane of the present invention during the process of the present invention.

Turning to FIG. 9 with continued reference to FIG. 3, the photon radiation source 400 is positioned 308 proximate to the membrane 100 to activate the substrate. The preferred radiation source is a CLARK MXR 2161 chirped pulse amplifier producing 120 femtosecond pulses between 1 kHz and 7 kHz and up to approximately 2.6 watts average power with a maximum pulse energy of 0.8 mJ output. The energy is passed through a half wave plate and thin film polarizer plate for power control. The half wave plate is adjusted for 35 mW. The power is proportional to the two photon cross section and thus controls the affected spotsize in conjunction with the objective lens. The laser energy is then focused into a Mitutoyo M Plan Apochromatic NIR HR objective lens 50× magnification 0.65 NA infinity corrected focal length of 200 and the working distance is approximately 1 cm. The beam diameter input may be between 1 mm and 6 mm, which allows for a variable NA. The intensity of the radiation source is optimized 310 to produce the ion passage channel characteristics as predefined. It is preferred that the spot size of a 775 nm wavelength be adjusted to produce a one micron width. At an appropriate starting point, the activated radiation source is actuated 312 in one-dimension across the surface of the membrane. The radiation source 400 radiates a path 190 along the surface and volume of the membrane substrate material. The preferred activation power is between 150-400 mJ/cm². A preferred scanning speed is 800 to 1000 mm/minute. The pulses will contact the membrane 100 in a position that corresponds to the peripheries of the membrane sidewalls that define the ion passage channels 102. Unlike the positive photoresist, the dimensions of the ion passage channels are only indirectly related to the laser beam position.

Figure 10:
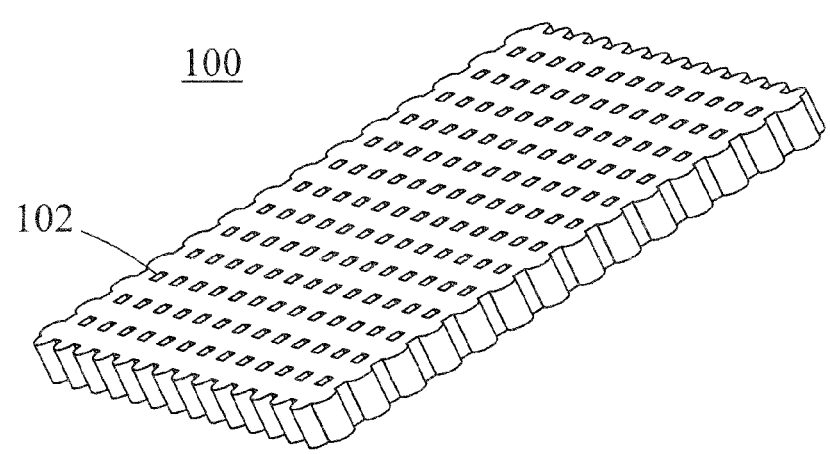
FIG. 10 is a perspective view of the membrane of the present invention.

FIG. 10 shows a membrane 100 that has been constructed according to applications of the process 300 of the present invention to negative photoresist material. The ion passage channels 102, rather than being substantially circular, include a polygonal shape. The body portions of the membrane substrate contacted by the radiation beam remain after development 314. Such a construction obviates the need to alter the beam cross-section dimensions to control the cross section dimensions of the ion passage channel. Instead, the diameter of the ion passage channel is primarily dictated by the level of control of the machinery actuating either the platform supporting the membrane or the radiation source. The present invention is amenable to either form of actuation, actuating platform radiation, actuating source radiation, or a combination of the two may be used in the construction of the membrane of the present invention. Ion passage channels may include diameters less than 1 um, and even down to 20 nm with adequate controls.

Developing 314 the negative photoresist membrane includes treatment with propylene glycol methyl ether acetate, PA-401D or PA-400D available from HD Microsystems, using a puddle method and rocking agitation for 55 seconds. The membrane is then rinsed with cyclopentanone, PA-400R available from HD Microsystems, for 10 seconds and dried with dry nitrogen. After development, the membrane is baked 314 on a hotplate at 150° C. for 2 minutes followed by 200° C. for 2 minutes. The membrane is then cured 314 in a nitrogen atmosphere by heating from room temperature to 200° C. at 10° C./min and held for 30 minutes. The membrane is then heated to 375° C. at 10° C./min and held for 60 minutes. The membrane is then gradually cooled to room temperature.

The radiation source of the present invention may use a lens that generates a laser pulse width of T=150 mrad, a beam diameter of 5 mm (Gaussian) and a desired focus spot size of 2W=3 um. Diffraction spot sizes may be determined by the formula:

$$2W = \frac{4}{\pi}\frac{\lambda f}{D}.$$

where f is the focal length. The Rayleigh range (depth-of-focus) is given by:

$$2z_0 = \frac{2\pi W^2}{\lambda}.$$

This is the distance that the beam diameter remains less than 1.414 times the focused spot size. For the spot size above, $2z_0 = 71.03$ μm.

Note that the depth-of-focus is determined primarily by the spot size. This is true for any focused beam, whether it is Gaussian or not; the only change is in the coefficient multiplying the spot size factor.

Figure 11:
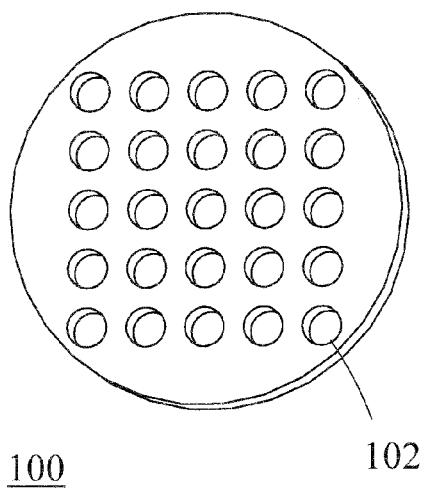
FIG. 11 is a perspective view of the membrane of the present invention.
Figure 12:
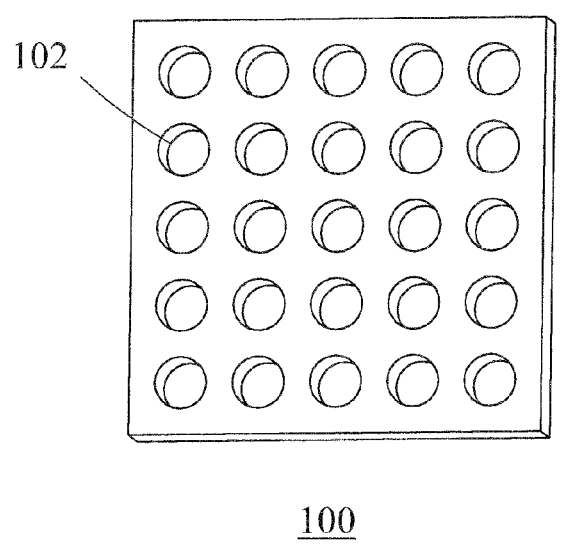
FIG. 12 is a perspective view of the membrane of the present invention.
Figure 13:
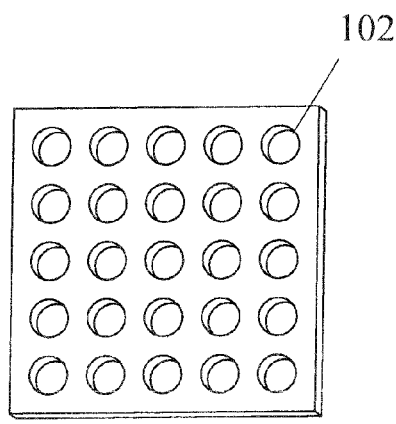
FIG. 13 is a perspective view of the membrane of the present invention.

As FIGS. 11-13 show, the membrane 100 of the present invention may include any shape suitable to achieve the aspects of the present invention. Furthermore, the substrate material may vary with the intended use of the membrane or constraints to the process of the present invention. With further reference to FIG. 2, it is preferred that the ion passage channels 102 be arranged in linear arrays of substantially linear rows. By substantially linear, it is meant purposefully linear and only irregular to the degree unavoidable by use contemporaneous machinery available to one of ordinary skill in the art. The linear arrays include consecutive ion passage channels. By consecutive it is meant that an ion passage channel's two nearest ion passage channels in one dimension are arranged substantially linearly. One of the particular problems posed by existing methods of membrane creation, particularly with the use of chemical means, is the random ion passage channel pore creation inherent in unregulated molecular dispersion. The use of ultrafast ablation permits regulation of ion passage channel position, and therefore regulation of ion passage channel density. The preferred pattern to permit high density ion passage channel formation is a series of linear arrays of substantially linear ion passage channels.

Figure 14:
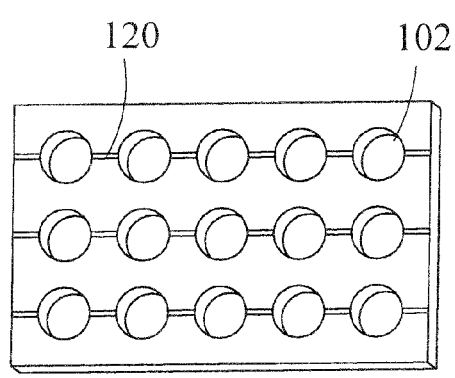
FIG. 14 is a perspective view of the membrane of the present invention.

The ability to establish known positions for ion passage channels permits meaningful interaction between the ion passage channels of the membrane. Turning now to FIG. 14 the membrane 100 of the present invention may support one or more current carriers 120 thereon. A current carrier is a medium capable of charge conduction from one location to another. For a membrane bound to another medium, it is preferred to use a glass slide or wafer that is indium tin oxide or gold coated to create a suitable current carrier. The current carrier may be prepatterned using lithography in linear rows to create the rows of an addressable array of linear electrochemical cells. The current carrier may include a metal film, e.g. copper, with the anode gel positioned atop the metal film. The current carrier may by coated by use of spin coating or dip coating with a sol-gel material such as molybdenum oxide or vanadium pentoxide, or it could be spray coated with a carbon nanotube suspension that is aerosolized and sprayed from an airbrush. Vanadium pentoxide and nanotubes may be positioned with chemical vapor deposition techniques. In the case of aqueous suspensions of carbon nanotubes, the substrate should be heated to greater than 200° C. for quick evaporation of the water component.

Figure 15:
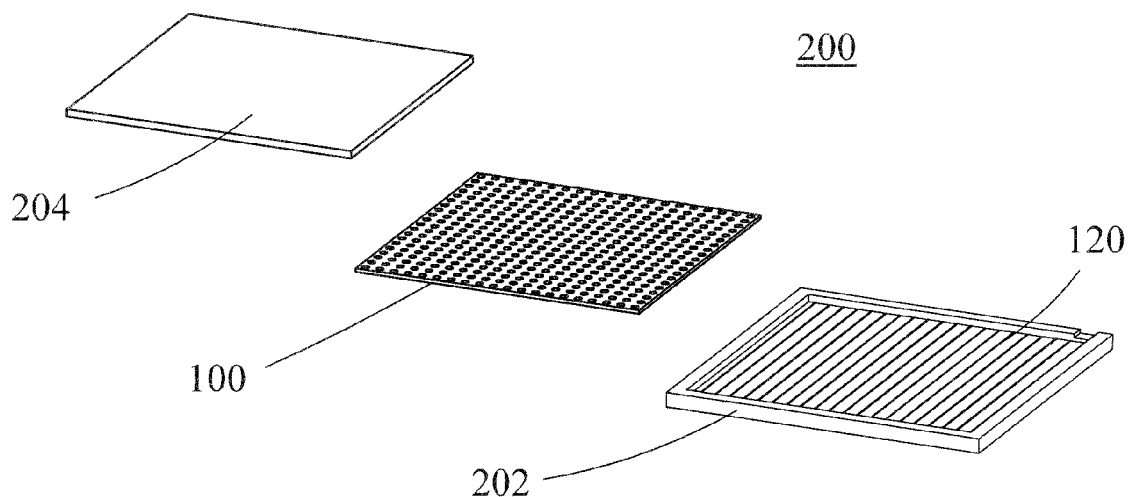
FIG. 15 is a perspective view of the ion exchange battery of the present invention.
Figure 16:
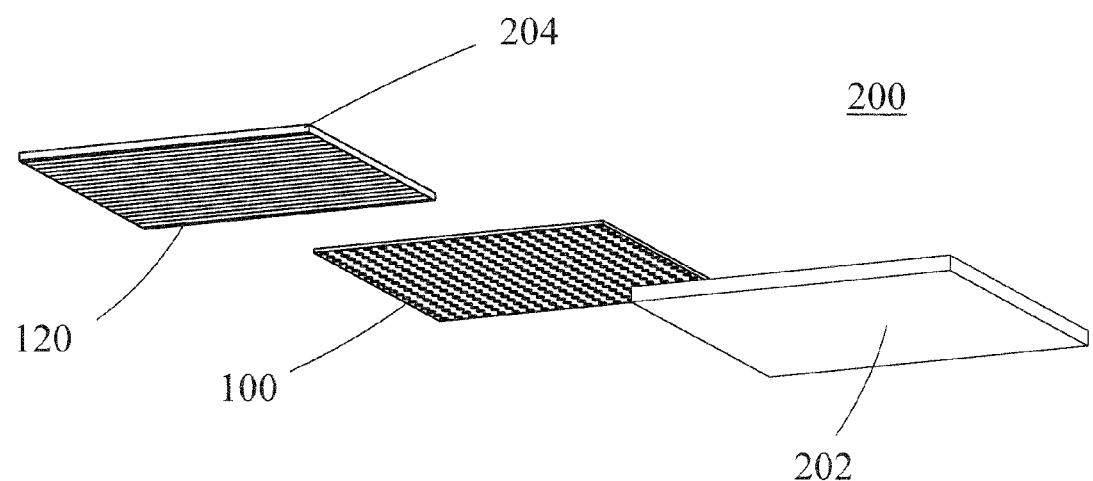
FIG. 16 is a perspective view of the ion exchange battery of the present invention.

Rather than coating the membrane 100 with current carrier, as FIGS. 15-16 show the electrode assembly of the cathode assembly 204 and anode assembly 202 may be coated with current carrier 120. Current carrier 120 may be affixed to the portions thereof that contact the membrane. The current carrier may by in electrical communication to a master wire that leads to a battery operating system. The battery operating system include logic that permits individual, groups, or all ion passage channels to be addressed according to requests stemming from the battery operating system. In such instances, it is preferred that the current carrier 120 of the anode assembly 202 be crossed relative to the current carrier of the cathode assembly 204. A crossed current carrier architecture permits a simplified physical architecture to allow the battery operating system to locate ion passage channels by simply activating a current carrier leading to the cathode assembly and a current carrier leading to the anode assembly. The ion passage channel that corresponds to the intersection of the activated current carriers is itself activated.

Returning to FIG. 3, the present invention includes adjusting 310 the intensity of the radiation source to complement the ablation threshold of a present material. Chirped-pulse laser amplification permits a user to study a damage threshold as a function of pulse duration. For longer pulses the damage threshold is stochastic and not very reproducible. However, for short duration pulses less than 5 ps≤($5 \times 10^{-12}$ s), the damage threshold becomes deterministic and is reproducible within 1%. In this regime the effect of thermal diffusion and shock waves are also minimal. Machining with femtosecond ($10^{-15}$ s) lasers according to the present invention permit controllable material modification with subwavelength feature sizes.

No material is immune to damage from high energy, focused laser beam where the induced electric field is high enough to produce non-linear optical breakdown. Material modification using laser has been possible since the electric field produced by the laser beam is comparable to the Coulomb field an electron sees in the proximity of the atomic nucleus leading to avalanche ionization. In this process, free electrons in the target material accelerate due to the high electric fields produced by the laser and create an avalanche of free electrons through collisions with other atoms. This process also occurs in transparent materials which become opaque when the free electron density approaches the critical density for that particular light. It is important to note that this optical breakdown has a non-linear dependence on intensity and this allows for the damage to be restricted to the subdiffraction limit by "thresholding" allowing the fabrication of nanoscale features.

Though, optically induced dielectric breakdown scales as $t^{1/2}$, where t is the pulse width for pulse durations longer than 10 ps, the damage threshold remains fairly constant (and deterministic) for shorter pulses. For ultra short pulses, polarization of the beam also plays an important part. Undesirable polarization effects can be reduced or eliminated by using a ¼ wave retardation plate or by using a spinning ½ wave retardation plate to change the polarization to circular in the case of the ¼ wave and rotate the linear polarized light by a spinning ½ wave plate. For single shot exposures a ¼ wave plate is more practical do the impracticalities of physically rotating a retarder at a rate sufficient to accommodate a single 150 fs pulse. This effect was pronounced at low pulse energy close to the threshold of the material. At low energy intensity, only the central part of the beam has enough energy to ablate the material and thus, in this energy regime, polarization plays an important part. For laser pulses with a Gaussian spatial beam profile, the diameter D of the ablated area is given by:

$$D^2 = 2\omega_0^2 \ln\frac{\phi_0}{\phi_{th}}$$

Here $\omega_0$ is the beam radius and $\phi_0$ and $\phi_{th}$ are the laser fluence and the threshold modification fluences, respectively. The laser fluence $\phi_0$ is related to the pulse energy by:

$$\phi_0 = \frac{2E_{pulse}}{\pi \omega_0^2}$$

Combining the two immediately above equations, the diameter of the ablated area d can be rewritten as:

$$d = \sigma \sqrt{\ln \frac{E_{pulse}}{\gamma}}$$

where $\sigma$ and $\gamma$ are fitting parameters: $\gamma$ gives the threshold energy.

Figure 17:
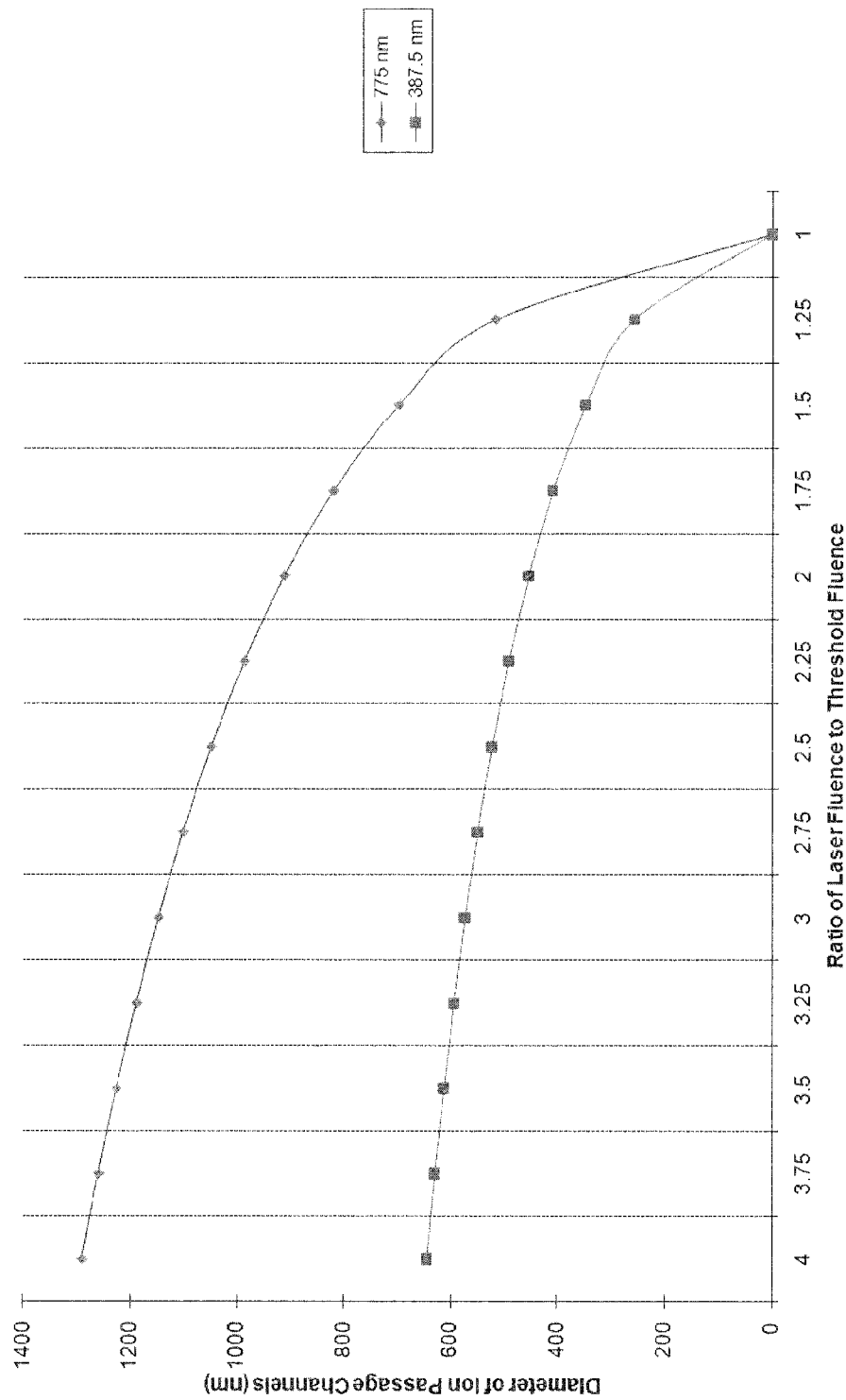
FIG. 17 is a results graph of the relationship of fluence ratios to ion passage channel diameter.

The above equation shows that for a given threshold energy, the diameter of the ablated area can be decreased by decreasing the pulse energy. Thus, by reducing the pulse energy to just above the threshold energy, ablation areas may be consistently machined to 20 nm in diameter. As FIG. 17 shows, the relationship of the fluence ratios ($\phi_0$ and $\phi_{th}$) directly determine the diameter of the ion passage channel created in the substrate material, particularly at ultrafast shot durations. The fluence threshold of the substrate material may be known, or determined experimentally through repeated laser beam intensity adjustment. As the fluence of the laser beam is generally available, the diameter of the channels created may be characterized, as shown by FIG. 18, in order to determine the fluence threshold of the substrate material. For example, to obtain a consistent array of 100 nm ion passage channels, a user may work backwards to determine the intensity of the laser beam required to account for an unknown material threshold fluence to achieve a fluence ratio of 1.034.

Ultrafast lasers permit a user to deposit energy impulsively into materials on time scales shorter than virtually all the characteristic relaxation times of interest. A necessary condition to take advantage of the unique characteristics of ultrafast laser excitation is that the absorbed energy be localized in the laser absorption volume on a time scale short compared to the thermal diffusion times of the substrate material; otherwise energy will dissipate out of the absorption zone before it is able to begin moving along the desired path of travel. Conditions pertinent to absorption volume energy confinement are characterized by:

$$\tau_p \ll \tau_{thermal} \approx \frac{L_p^2}{D_{thermal}}, \tau_p \leq \tau_s \approx \frac{L_p}{C_s}$$

where $\tau_p$ is the pulse duration, and $\tau_{thermal}$ and $\tau_s$ are, respectively, the thermal and stress confinement times. $L_p$ is the optical penetration depth, $D_{thermal}$ is the characteristic diffusion constant of the substrate material, and $C_s$ is the speed of sound in the substrate material. Pulse durations of 100 ps or less tend to be thermally and mechanically confined, even in metals. For nonmetals, penetration depths are much greater and thus stress confinement is often a more pressing issue. Constraints on thermal and mechanical confinement of the laser-induced modification depend critically on the strength of the electron-lattice or electron-phonon coupling, and determine the ultimate temporal and length scales associated with the laser-induced materials modification.

Figure 19:
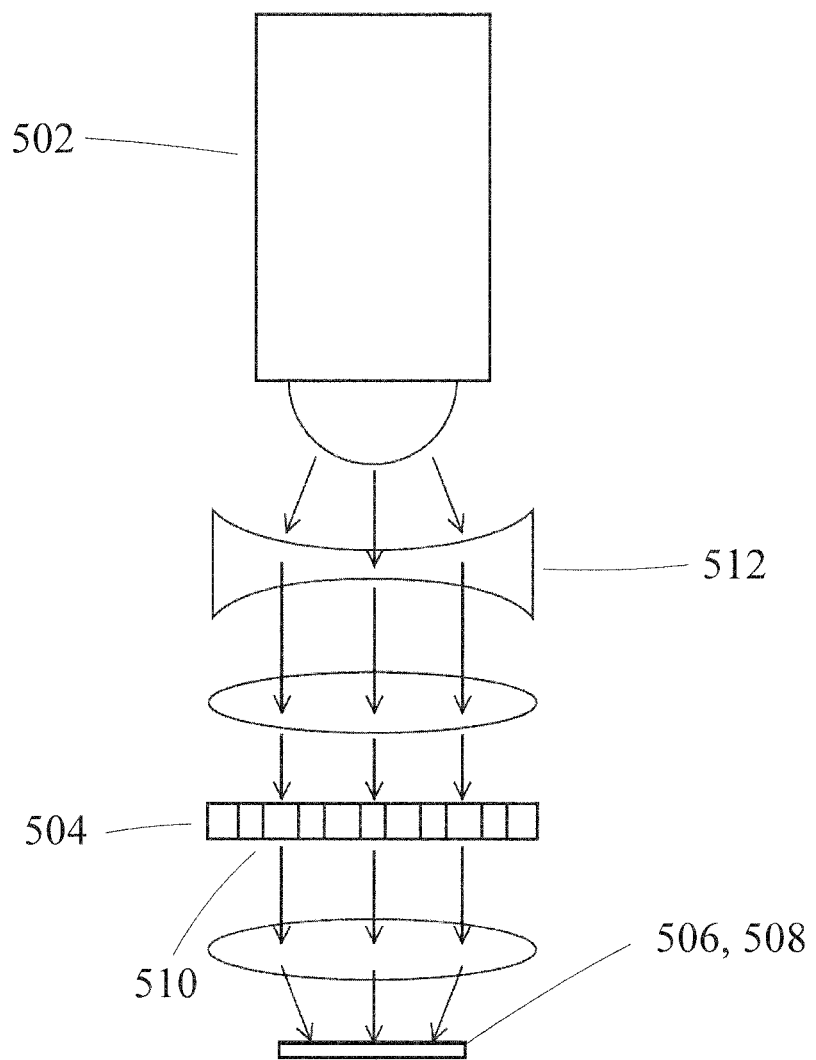
FIG. 19 is a view of a preferred constant radiation system of the present invention.
Figure 20:
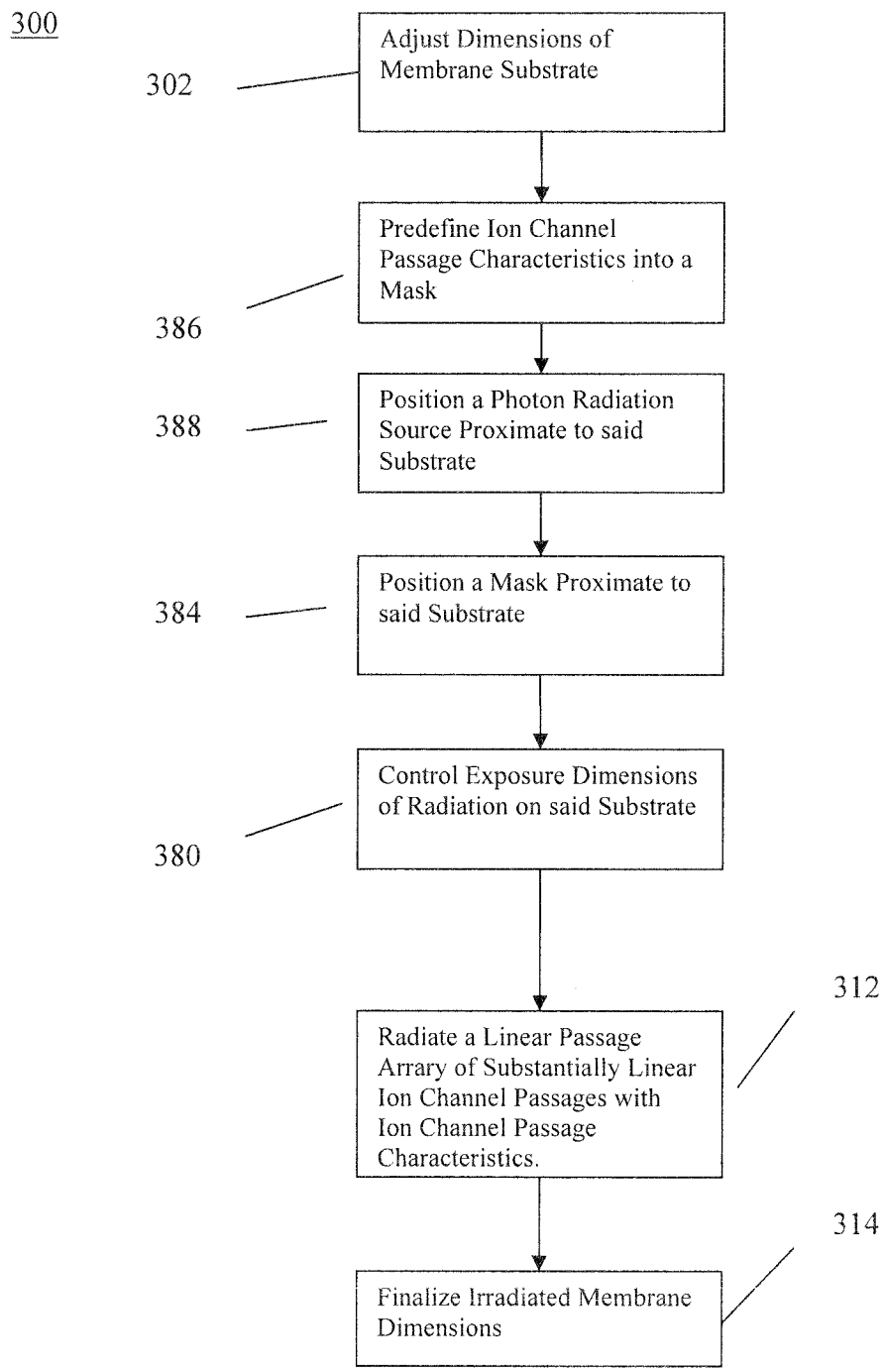
FIG. 20 is a view of the process of the present invention.

Although certain preferred embodiments utilize a laser with a temporally-constrained pulse, the present invention may be practiced with any radiation source of any pulse duration—including constant radiation. An example of a further means of manipulating a membrane substrate includes use of an arc lamp 502 and a mask 504 as shown in FIG. 19. Viewing FIG. 19 in conjunction with FIG. 20, the process 300 of the present invention includes using an arc lamp 502, or other radiation source, positioned 388 proximate to a substrate material 506. The mask is a material having dimensions and apertures adapted to selectively allow the passage of radiation therethrough. The mask openings 510 are spaced and sized to correspond to the spacing, sizing, and positioning of the ion passage channels as they would appear in the substrate or other desired target material. Depending on whether a positive tone or negative tone photoresist is utilized as a target, the selectively transmission of light through the mask may define either the ion channel passages or the borders thereof. Ion channel passage characteristics are predetermined 386 and the mask is constructed to accommodate those predetermined ion channel passage characteristics. The mask 504 is positioned 384 between the substrate 506 and the arc lamp 502 at a distance desirable to control 380 radiation exposure upon the surface of the substrate. Controlling 380 radiation exposure includes any means by which the radiation, as it contacts the substrate, may be controlled according to its dimensions to accord with the predefining ion channel passage characteristics. This includes placement of the mask in a position that contacts the substrate, which allows for a generally direct, i.e. 1:1, correspondence of radiation passage as allowed by mask structure and substrate structure radiation exposure, and placement at any position between a surface of the substrate and the radiation source, which may, for example, permit enlargement of the radiation exposure relative to the structure of the mask that permits radiation passage. The radiation exposure dimensions may be further controlled 380 with optical controls, 512 e.g. reduction optics or magnification optics, e.g. positioned between the mask and the radiation source.

Figure 21:
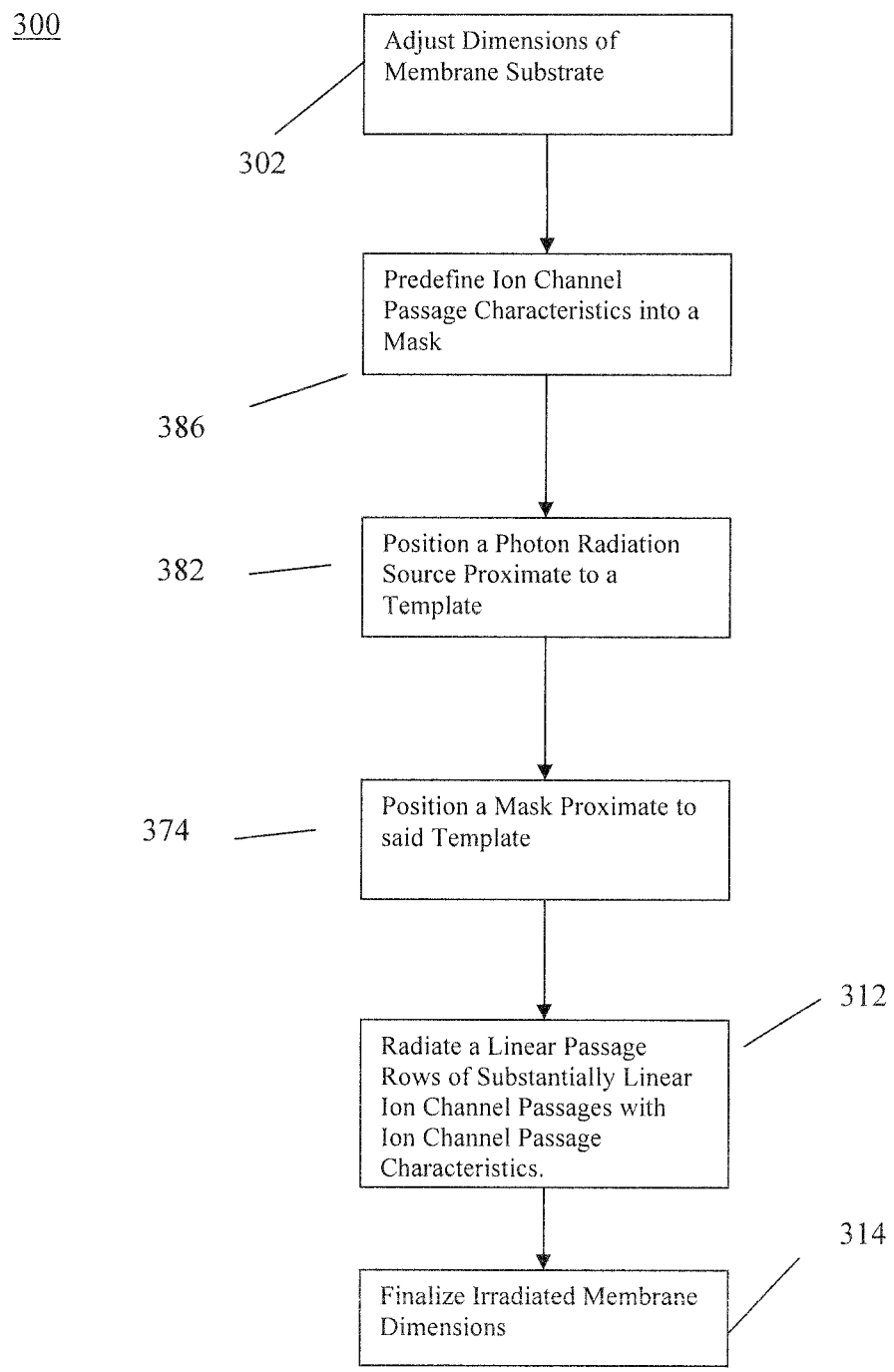
FIG. 21 is a view of the process of the present invention.

As FIG. 19 and FIG. 21 demonstrate, the lithography process 300 of the present invention may apply directly to the substrate to create the membrane of the present invention, or the process 300 may be applied to a template 508. The template 508 photoresist is positioned 382 proximate to the radiation source 502, and the mask 504 is positioned between the template and the radiation source 502. The template 508 after accepting 312 radiation is in turn is utilized as a mold to interact with the substrate to finalize 314 the dimensions of the membrane. The preferred means of finalizing 314 in the lithography process of FIG. 21 includes press-fitting the substrate upon the template along with other finalization steps necessary to conform the substrate material to the desired characteristics of the membrane.

As FIG. 19 shows, the mask 504 may be constructed for positive-tone or negative-tone photoresists. The mask 504 includes openings 510 that correspond to the pattern desired to be exposed on the substrate. The mask may use material such that it is durable, i.e. may be reused; or disposable after a single pulse or series of pulses for a particular substrate. Depending on the substrate material characteristics, the exposed portions of the substrate material are then either washed away or isolated by washing away unexposed portions.

Although the present invention has been described in considerable detail with reference to certain preferred versions thereof, other versions would be readily apparent to those of ordinary skill in the art. Therefore, the spirit and scope of the appended claims should not be limited to the description of the preferred versions contained herein.

What is claimed is:

1. A method for fabricating a membrane for an ion-exchange electrochemical cell, said method comprising:
    positioning a negative tone photoresist substrate with a girth;
    predefining polygonal ion passage channel dimensions;
    positioning a photon radiation source proximate to said substrate;
    linearly actuating said substrate with respect to said radiation source to radiate a first linear row through said girth of said substrate;
    linearly actuating said substrate with respect to said radiation source to radiate a second linear row, substantially parallel to said first linear row, through said girth of said substrate;
    linearly actuating said substrate with respect to said radiation source to radiate at least two boundary rows, contacting said first linear row and said second linear row, through said girth of said substrate; and
    dissolving unradiated substrate portions.

2. The method of claim 1 wherein said linearly actuating said substrate with respect to said radiation source to radiate at least two boundary rows step includes linearly actuating said substrate with respect to said radiation source to radiate at least two substantially parallel boundary rows, contacting said first linear row and said second linear row, through said girth of said substrate.

3. The method of claim 1 wherein said predefining step includes predefining substantially uniform polygonal ion passage channel dimensions.

4. A method for forming an electrochemical cell membrane comprising:
    predefining ion channel passage characteristics;
    positioning a negative tone photoresist substrate proximate to a radiation source;
    positioning between said substrate and said radiation source a mask with mask openings dimensioned to correspond to said ion channel passage characteristics; and
    radiating at least one row of substantially linear ion channel passages with ion channel passage characteristics upon said substrate.

5. The method of claim 4 wherein said mask positioning step further includes positioning between said substrate and said radiation source a durable mask with mask openings dimensioned to correspond to said ion channel passage characteristics.

6. The method of claim 4 further comprising controlling exposure dimensions of radiation on said substrate.

7. The method of claim 6 wherein said radiating step further comprises radiating at least one row of substantially linear ion channel passages with a channel diameter of less than 100 μm.

8. The method of claim 7 wherein said radiating step further comprises radiating at least one row of substantially linear ion channel passages with a channel diameter of less than 50 μm.

9. The method of claim 8 wherein said radiating step further comprises radiating at least one row of substantially linear ion channel passages with a channel diameter of less than 600 nm.

10. The method of claim 9 wherein said radiating step further comprises radiating at least one row of substantially linear ion channel passages with a channel diameter of less than 300 nm.

11. The method of claim 10 wherein said radiating step further comprises radiating at least one row of substantially linear ion channel passages wherein each of said ion passage channels includes a channel diameter within +/−10 percent of said diameter of said at least one neighboring ion passage channel.

12. The method of claim 11 wherein said radiating step further comprises radiating at least one row of substantially linear ion channel passages wherein each of said ion passage channels includes a channel diameter within +/−2 percent of said diameter of said at least one neighboring ion passage channel.

* * * * *